(12) United States Patent
Bonart et al.

(10) Patent No.: US 9,704,839 B2
(45) Date of Patent: Jul. 11, 2017

(54) SEMICONDUCTOR DEVICES FOR INTEGRATION WITH LIGHT EMITTING CHIPS AND MODULES THEREOF

(71) Applicant: Infineon Technologies AG, Neubiberg (DE)

(72) Inventors: Dietrich Bonart, Bad Abbach (DE); Bernhard Weidgans, Bernhardswald (DE); Johann Gatterbauer, Parsberg (AT); Thomas Gross, Sinzing (DE); Martina Heigl, Bogen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/945,170

(22) Filed: Nov. 18, 2015

(65) Prior Publication Data

US 2017/0141090 A1   May 18, 2017

(51) Int. Cl.
| | | |
|---|---|---|
| *H01L 33/00* | (2010.01) | |
| *H01L 25/16* | (2006.01) | |
| *H01L 33/62* | (2010.01) | |
| *H01L 33/60* | (2010.01) | |
| *H01L 21/66* | (2006.01) | |
| *H01L 21/768* | (2006.01) | |
| *H01L 23/00* | (2006.01) | |
| *H01L 23/528* | (2006.01) | |

(Continued)

(52) U.S. Cl.
CPC ...... *H01L 25/167* (2013.01); *H01L 21/76834* (2013.01); *H01L 21/76877* (2013.01); *H01L 22/20* (2013.01); *H01L 23/528* (2013.01); *H01L 23/5226* (2013.01); *H01L 23/53214* (2013.01); *H01L 23/53228* (2013.01);

(Continued)

(58) Field of Classification Search
CPC .......... H01L 2924/12041; H01L 33/62; H01L 33/60; H01L 2224/48227; H01L 33/405; H01L 31/055; H01L 33/46
See application file for complete search history.

(56) References Cited

U.S. PATENT DOCUMENTS

| | | | | |
|---|---|---|---|---|
| 6,163,436 A | * | 12/2000 | Sasaki | G11B 5/3116 360/123.48 |
| 2008/0069491 A1 | * | 3/2008 | Kissa | G02F 1/0123 385/2 |

(Continued)

OTHER PUBLICATIONS

Kessels, W. M. M., et al., "Film growth precursors in a remote SiH4 plasma used for high-rate depostion of hydrogenated amorphous silicon," Journal Vaccuum Science Technology (JVST), vol. 18, No. 5, Sep./Oct. 2000, pp. 2153-2163.

(Continued)

*Primary Examiner* — Nhan Ngo
(74) *Attorney, Agent, or Firm* — Slater Matsil, LLP

(57) ABSTRACT

A semiconductor device includes an active region disposed in a semiconductor substrate and an uppermost metal level including metal lines, where the uppermost metal level is disposed over the semiconductor substrate. Contact pads are disposed at a major surface of the semiconductor device, where the contact pads are coupled to the metal lines in the uppermost metal level. An isolation region separates the contact pads disposed at the major surface. Adjacent contact pads are electrically isolated from one another by a portion of the isolation region. Reflective structures are disposed between the upper metal level and the contact pads, where each of the reflective structures that is directly over the active region completely overlaps an associated portion of the isolation region separating the contact pad.

27 Claims, 15 Drawing Sheets

(51) Int. Cl.
H01L 23/522 (2006.01)
H01L 23/532 (2006.01)
H01L 31/055 (2014.01)
H01L 33/40 (2010.01)
H01L 33/46 (2010.01)

(52) U.S. Cl.
CPC .............. *H01L 24/03* (2013.01); *H01L 24/06* (2013.01); *H01L 31/055* (2013.01); *H01L 33/405* (2013.01); *H01L 33/46* (2013.01); *H01L 33/60* (2013.01); *H01L 33/62* (2013.01); *H01L 2224/05144* (2013.01); *H01L 2224/48227* (2013.01); *H01L 2924/12041* (2013.01); *H01L 2933/0058* (2013.01); *H01L 2933/0066* (2013.01)

(56) References Cited

U.S. PATENT DOCUMENTS

| 2009/0201042 | A1* | 8/2009 | Sellathamby | G09G 3/006 324/754.29 |
| 2014/0159091 | A1* | 6/2014 | Hon | H01L 33/44 257/98 |
| 2016/0254428 | A1* | 9/2016 | Ting | H01L 33/0079 |
| 2016/0260869 | A1* | 9/2016 | Jeon | H01L 33/38 |
| 2016/0276538 | A1* | 9/2016 | Zhao | H01L 33/385 |

OTHER PUBLICATIONS

Kesssels, W. M. M., et al., "Hydrogented amorphous silicon deposited at very high growth rates by expanding Ar—H2—SiH4 plasma," Journal of Applied Physics, vol. 89, No. 4, Feb. 15, 2001, pp. 2404-2413.

Moravej, M., et al. "Plasma enhanced chemical vapour deposition of hydrogenated amorphous silicon at atmosphere pressure," Plasma Sources Science and Technology, PII: S0963-0252(04)67711-5, Nov. 11, 2003, pp. 8-14.

Tanenbaum, D. M., et al., "Surface roughening during plasma enhanced chemical vapor deposition of hydrogenated amorphous silicon on crystal silicon substrates," Physical Review B., vol. 56, No. 7, pp. 4242-4250.

* cited by examiner

SEMICONDUCTOR DEVICES FOR INTEGRATION WITH LIGHT EMITTING CHIPS AND MODULES THEREOF

TECHNICAL FIELD

The present invention relates generally to semiconductor devices and modules, and, in particular embodiments, to semiconductor devices for integration with light emitting chips and modules thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

Light emitting diodes are used in a number of applications for lighting, displays, televisions, monitor screens, and others. In many such applications, a plurality of light emitting diodes (LEDs), which may be discrete LEDs or an array of LEDs, is connected to a silicon driver chip. The silicon driver chip controls the LED parameters such as turning on/off as well as the brightness and others.

SUMMARY

In accordance with an embodiment of the present invention, a semiconductor device includes and active region disposed in a semiconductor substrate, an uppermost metal level including metal lines, where the uppermost metal level disposed over the semiconductor substrate. Contact pads are disposed at a major surface of the semiconductor device, where the contact pads are coupled to the metal lines in the uppermost metal level. An isolation region separates the contact pads disposed at the major surface, where adjacent contact pads are electrically isolated from one another by a portion of the isolation region. Reflective structures are disposed between the upper metal level and the contact pads, where each of the reflective structures that is directly over the active region completely overlaps an associated portion of the isolation region separating the contact pad.

In various embodiments, the device further includes a contact via coupled between the one of the metal lines in the uppermost metal level to one of the contact pads, and a sidewall spacer electrically isolating the contact via from the reflective structures. In one embodiment, the reflective structures include a different composition from the contact pads and the metal lines in the uppermost metal level. In one embodiment, the contact pads and the reflective structures together are configured to reflect all light in visible wavelength above 400 nm falling on the major surface of the semiconductor device. In one embodiment, a light emitting diode (LED) chip is directly soldered to the contact pads. In one embodiment, the reflective structures overlap with the contact pads over an overlap distance at each side. In one embodiment, the overlap distance is between 500 nm to 5 micron. In one embodiment, the reflective structures include gold, silver, or substantially aluminum, where the contact pads include substantially gold, and where the metal lines in the uppermost metal level include substantially copper. In one embodiment, the device further includes amorphous semiconductor structures disposed between the reflective structures and the upper metal level. In one embodiment, the amorphous semiconductor structures have a thickness of 0.2 micron to 1 micron. In one embodiment, the amorphous semiconductor structures include amorphous silicon, or fluorinated amorphous silicon.

In accordance with an embodiment of the present invention, a semiconductor device includes an uppermost metal level includes metal lines, the uppermost metal level being disposed over a semiconductor substrate. The device further includes contact pads disposed at a major surface of the semiconductor device, the contact pads being coupled to the metal lines in the uppermost metal level. The device further includes light absorptive structures disposed between the upper metal level and the contact pads, where the light absorptive structures include an amorphous semiconductor material.

In one or more embodiments, the device further includes a contact via coupled between the one of the metal lines in the uppermost metal level to one of the contact pads; and a sidewall spacer electrically isolating the contact via from the light absorptive structures. In one embodiment, the light absorptive structures are aligned with an isolation region separating the contact pads, where each one of the light absorptive structures is disposed directly under an associated portion of the isolation region. The light absorptive structures have a thickness of 0.2 micron to 1 micron. The amorphous semiconductor material includes amorphous silicon or fluorinated amorphous silicon. The reflective structures are disposed between the upper metal level and the contact pads, where the reflective structures are aligned to be directly under gaps between adjacent contact pads. The reflective structures partially overlap with the contact pads, where the reflective structure includes a different metal than the contact pads and the metal lines in the uppermost metal level.

In accordance with an embodiment of the present invention, a method of forming a semiconductor device includes forming uppermost metal level comprising metal lines, the uppermost metal level being formed over a semiconductor substrate. The method further includes forming light reflective/absorptive structures over the upper metal level, and forming contact pads over the light reflective/absorptive structures by aligning the light reflective/absorptive structures to be directly below gaps between adjacent contact pads.

In one or more embodiments, the contact pads overlap with the light reflective/absorptive structures, wherein the light reflective/absorptive structures comprises a different composition from the contact pads and the metal lines in the uppermost metal level. In one embodiment, forming the light reflective/absorptive structures comprises forming amorphous semiconductor structures over the metal lines and forming reflective structures over and aligned with the amorphous semiconductor structures.

In one embodiment, forming the light reflective/absorptive structures comprises forming reflective structures over the metal lines.

In one embodiment, the method further comprises forming a protective layer over the light reflective/absorptive structures, wherein the contact pads are formed over the protective layer. In one embodiment, the protective layer comprises a non-planar major surface.

In one embodiment, forming the light reflective/absorptive structures comprises forming amorphous semiconductor structures over the metal lines, the amorphous semiconductor structures overlapping with the contact pads.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a cross-sectional view of a driver chip comprising overlapping contact pads with reflective pads in accordance with an embodiment of the present invention, wherein

FIGS. 4A-4D illustrate a semiconductor device during various stages of fabrication in accordance with embodiments of the present invention, wherein FIG. 4A illustrates a semiconductor device after completion of typical metallization processes, wherein FIG. 4B illustrates the semiconductor device after forming a patterned resist layer, wherein FIG. 4C illustrates the semiconductor device after forming a patterned reflective layer, wherein FIG. 4D illustrates the semiconductor device after forming a protective layer;

FIGS. 5A-5D illustrate a semiconductor device during various stage of fabrication with a light absorption structure in accordance with alternative embodiments of the present invention, wherein FIG. 5A illustrates a semiconductor device after forming an amorphous layer over the top most metal level, wherein FIG. 5B illustrates a semiconductor device after forming an opening, wherein FIG. 5C illustrates a semiconductor device after forming insulating sidewalls spacers, wherein FIG. 5D illustrates a semiconductor device after filling the openings with a conductive material, wherein

FIGS. 6A-6C illustrate alternative embodiments combining the prior embodiments, wherein FIG. 6A illustrates a metallic layer and whereas FIGS. 6B and 6C illustrate both a metallic layer and the amorphous layer;

FIGS. 7A-7F illustrate various stages of fabricating a semiconductor device having an amorphous structure and a reflective layer on different levels in accordance with an embodiment of the present invention, wherein FIG. 7A illustrates a cross-sectional view of a semiconductor device during fabrication after forming a patterned amorphous structure over the metallization of a semiconductor substrate, wherein FIG. 7B illustrates a cross-sectional view of a semiconductor device during fabrication after covering the patterned amorphous structure with a protective layer, wherein FIG. 7C illustrates a cross-sectional view of a semiconductor device during fabrication after covering the patterned amorphous structure with a protective layer, wherein FIG. 7D illustrates a cross-sectional view of a semiconductor device during fabrication after forming a reflective metal layer, wherein FIG. 7E illustrates a cross-sectional view of a semiconductor device during fabrication after forming openings in the reflective metal layer, wherein FIG. 7F illustrates a cross-sectional view of a semiconductor device during fabrication after forming pads;

DETAILED DESCRIPTION OF ILLUSTRATIVE EMBODIMENTS

In some light emitting diode (LED) applications, the LEDs are mounted directly to a silicon chip in a common package. In such applications, the silicon chip may be exposed to large amounts of scattered light that originate from the LEDs. The photons from the scattered light may be absorbed by the silicon substrate and produce leakage currents by electron-hole generation. This may lead to erratic currents which may disturb the functioning of the circuit within the silicon chip.

Additionally, in the case of LED-matrix arrays mounted directly to a silicon chip, the exposed area of the silicon chip next to the LED-matrix arrays is exposed to high intensity radiation with wavelengths in the range 250 nm to 350 nm during the laser-lift-off process. This is because during the laser lift-off process, a sapphire carrier substrate is removed from the LED-matrix array by laser heating of the LED-matrix array/sapphire carrier interface.

Figure 1A:
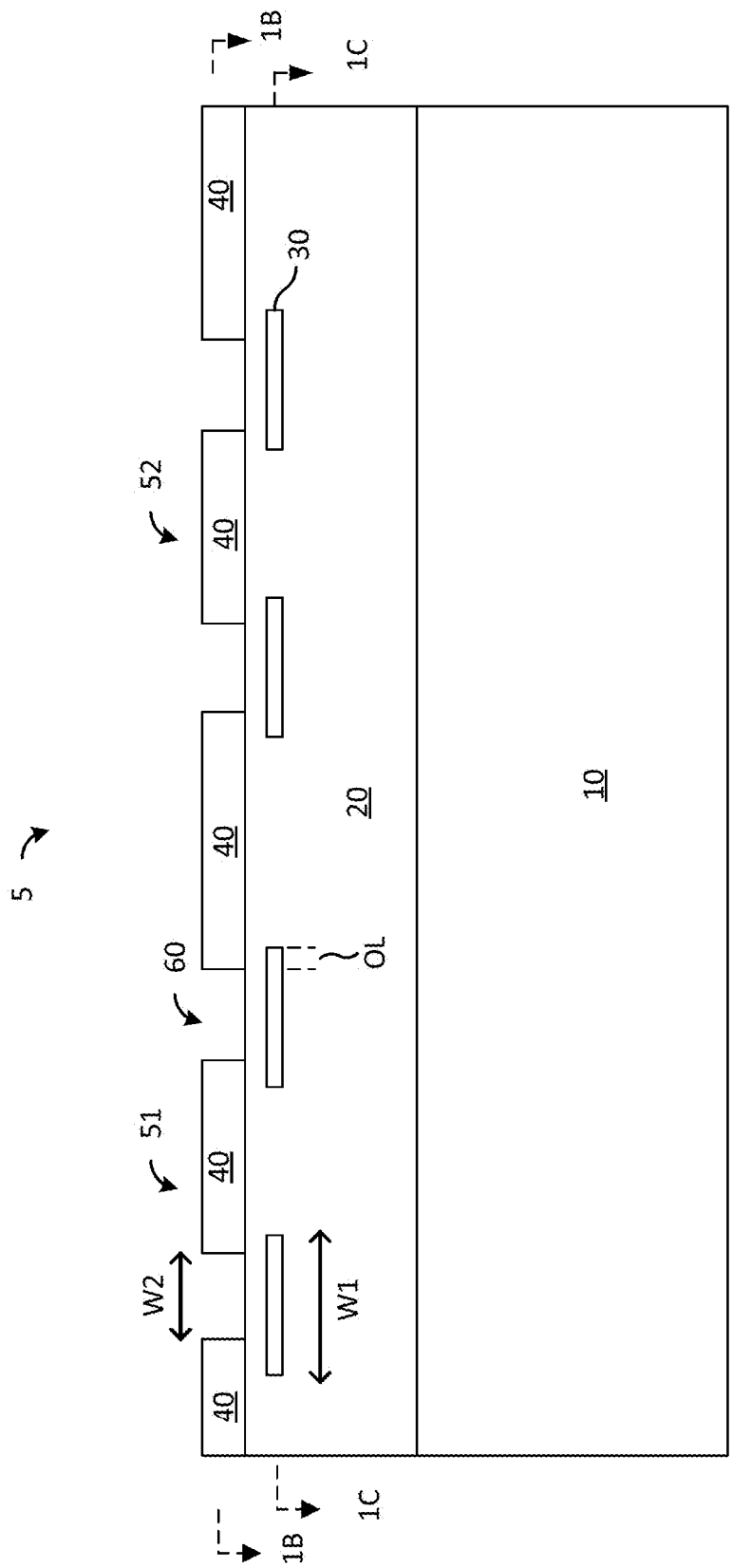
Figure 1B:
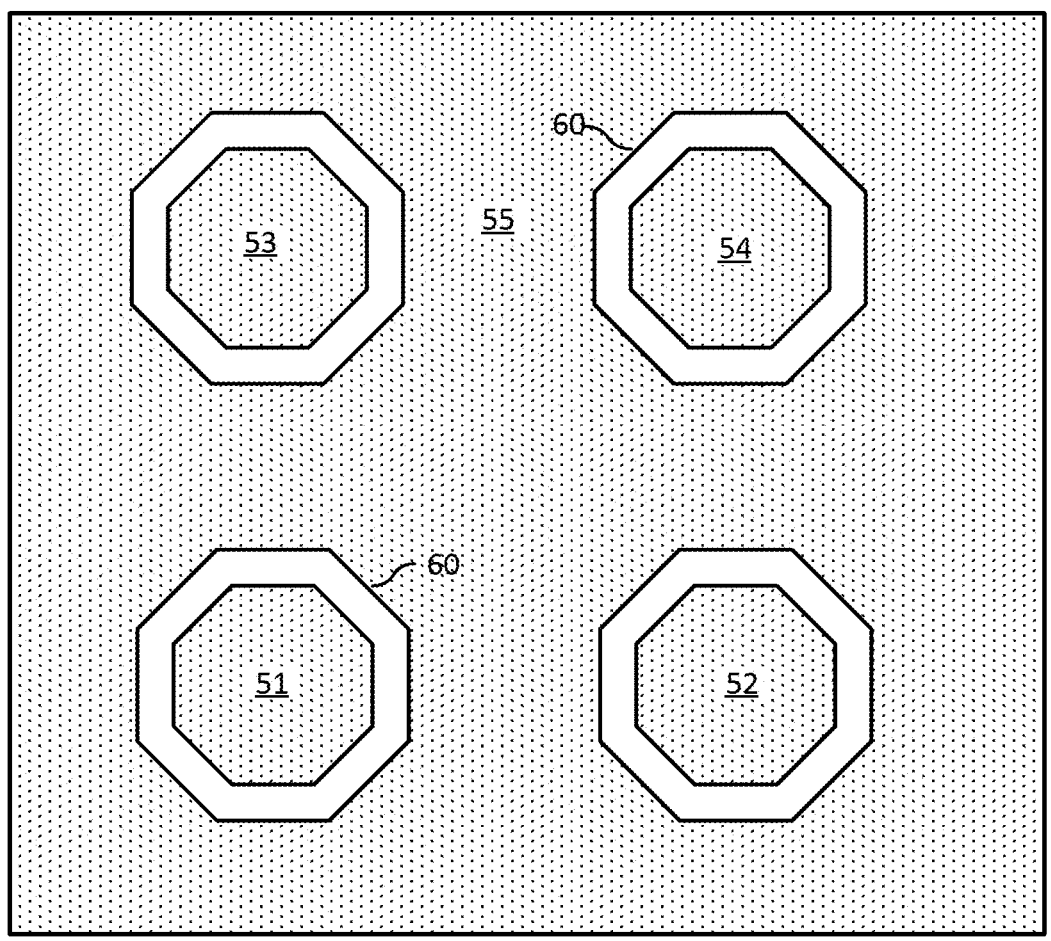
FIG. 1B illustrates a top sectional view of the driver chip illustrating the contact pads and FIG. 1C illustrates a top sectional view of the driver chip illustrating the light reflection/absorption pads.
Figure 1C:
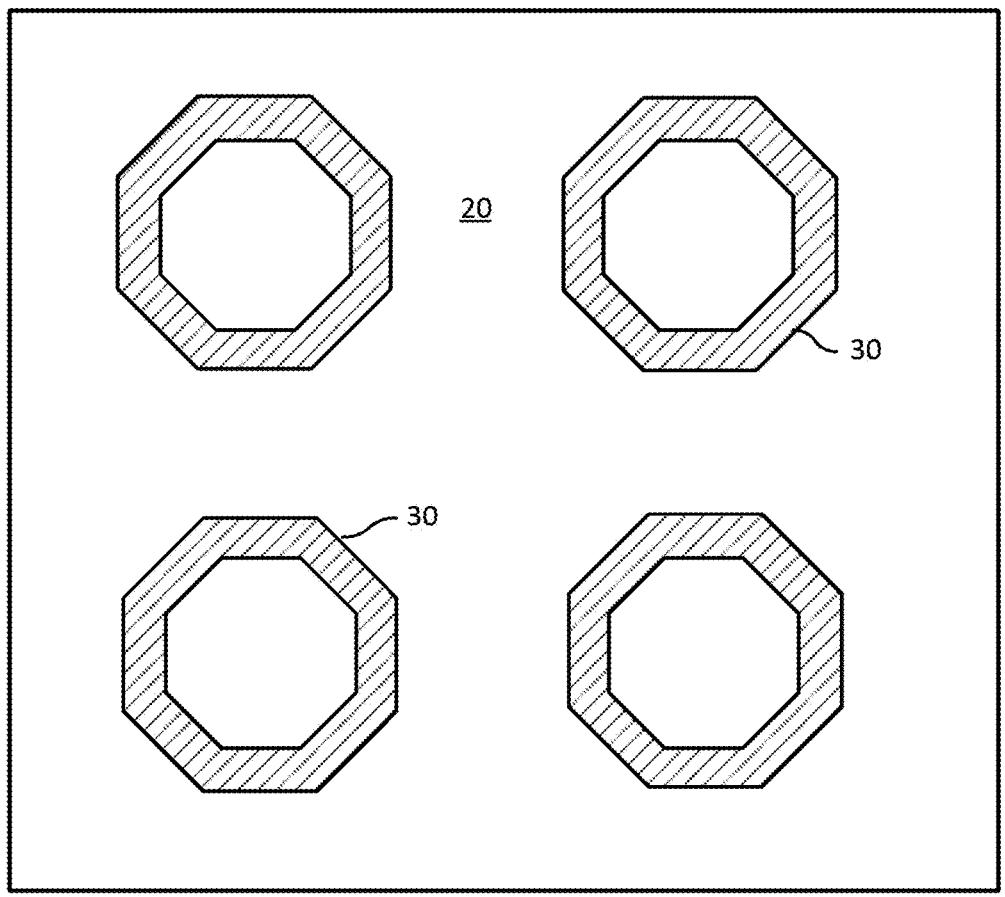

FIG. 1A illustrates a cross-sectional view of a driver chip comprising overlapping contact pads with reflective pads in accordance with an embodiment of the present invention. FIG. 1B illustrates a top sectional view showing the contact pad while FIG. 1C illustrates a top sectional view showing the reflective pad.

Referring to FIG. 1A, a driver chip 5 may comprise a semiconductor substrate 10 on which the functional elements are formed. A metallization layer 20 is formed over the semiconductor substrate 10. The driver chip 5 includes contact pad structures 40 for contacting the various components of the driver chip 5. In various embodiments, the contact pad structures 40 comprise a metallic pad comprising metals such as gold, silver, aluminum, copper, and others.

In various embodiments, a part of the driver chip 5 is exposed through the openings 60 that are between contact pad structures 40. This is because the contact pad structures 40 cover only a fraction of the total surface area of the driver chip 5. Except for the regions of the driver chip 5 directly beneath the driver chip 5, the remaining part of the driver chip 5 is directly exposed to any radiation hitting the surface of the driver chip 5. Further, due to light diffraction, almost all regions of the driver chip 5 may be exposed to any impinging light.

In various embodiments, light reflection/absorption pads 30 are formed in or above the metallization layers 20 of the driver chip 5. The light reflection/absorption pads 30 are made to have a first width w1 wider than a second width w2 of the openings 60 to eliminate light rays that are angled from reaching the substrate 10. Although, only one dimension is shown in FIG. 1A, in the other dimension that is in the same plane parallel to the substrate 10, the light reflection/absorption pads 30 similarly extend under the contact pad structures 40.

In various embodiments, the size of the light reflection/absorption pads 30 is about 10% to 30% larger than the size of the openings 60. In various embodiments, the light reflection/absorption pads 30 overlap to about 1 to 2 microns with the contact pad structures 40 on each side. This overlap distance OL is illustrated in FIG. 1A. In one embodiment, the light reflection/absorption pads 30 overlap to 500 nm to 5 micron.

Figure 9:
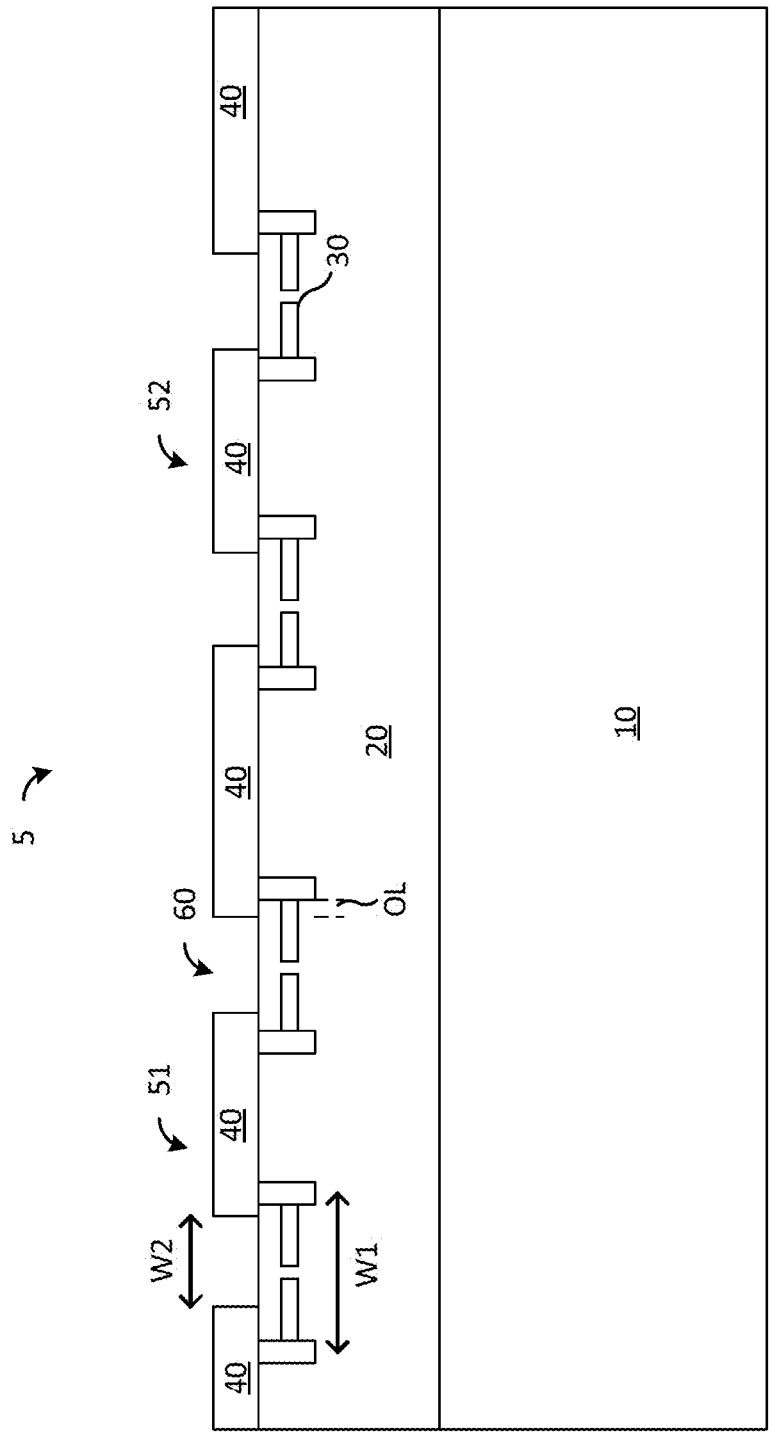
FIG. 9 illustrates a cross sectional view of a semiconductor device in which the reflective structures are designed to minimize parasitic effects in accordance with embodiments of the present invention.

In one or more embodiments, the light reflection/absorption pads 30 are disposed under all areas of the driver chip 5 that do not have the contact pad structures 40. The light reflection/absorption pads 30 may not be electrically connected to any component or device in the substrate 10 in one or more embodiments. However, in some embodiments, the light reflection/absorption pads 30 may be coupled to a ground potential. FIG. 9 further illustrates alternative possibilities for connecting the light reflection/absorption pads 30 to avoid parasitic effects. In other embodiments, as will be described in different embodiments, light reflection/absorption pads 30 are coupled to the contact pad structures 40.

FIG. 1B illustrates a top sectional view of the driver chip illustrating the contact pads in accordance with an embodiment of the present invention.

Referring to FIG. 1B, the top side of the driver chip 5 includes contact pads such as a first contact pad 51, a second contact pad 52, a third contact pad 53, and a fourth contact pad 54. In some embodiments, the remaining of the contact pad structures may be pad structures 55 that are not contacts to underlying device regions of the substrate 10. In further embodiments, the contact pads may be closed spaced so that the pad structures 55 are avoided. FIG. 1B also shows the openings 60 that isolate adjacent ones of contact pads. Without the openings 60, all devices on the substrate 10 would be shorted because adjacent contact pads would be electrically connected. However, the openings 60 leave open entry points for light to enter the substrate 10. This is because light is not reflected by any isolation material that could be used to fill the openings 60. Further, the isolation material of the metallization layer 20 may be transparent or translucent. However, as further described in FIG. 1C, in various embodiments, the light reflection/absorption pads 30 block these entry points for light entry into the substrate 10.

FIG. 1C illustrates a top sectional view of the driver chip illustrating the light reflection/absorption pads in accordance with an embodiment of the present invention.

Referring to FIG. 1C, entry points for the light into the substrate 10 from the openings 60 are blocked by the light reflection/absorption pads 30. In various embodiments, the light reflection/absorption pads 30 comprise a metallic material such as silver, aluminum, gold and other reflective materials.

Accordingly, in various embodiments, the driver chip 5 is completely encapsulated by the combination of the light reflection/absorption pads 30 and the contact pad structures 40. As a consequence, all light that is directed towards the driver chip 5 is reflected back without producing leakage currents in the driver chip 5.

Figure 2:
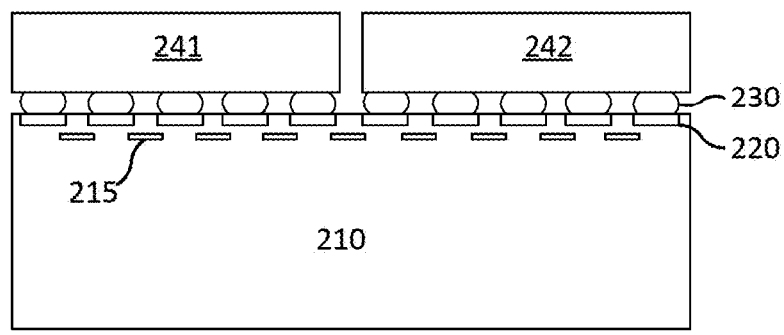
FIG. 2 illustrates a package comprising a LED matrix chip soldered to a driver chip in accordance with embodiments of the present invention.

FIG. 2 illustrates a package comprising a LED matrix chip soldered to a driver chip in accordance with embodiments of the present invention.

Referring to FIG. 2, the package comprises a common chip 210, for example, a driver chip, having a plurality of contact pads 220. The plurality of contact pads 220 couple to various circuits within the substrate of the common chip 210. A first LED matrix array 214 and a second LED matrix array 242 are soldered to the plurality of contact pads 220 through solder bonds 230.

A plurality of reflective structures 215 is disposed under the openings between the plurality of contact pads 220. The plurality of reflective structures 215 reflect and/or absorb all light entering the common chip 210 through the openings between the plurality of contact pads 220. As described in various embodiments, the plurality of reflective structures 215 are designed to be directly underneath the plurality of contact pads 220 but are also larger than the openings between the plurality of contact pads 220.

Figure 3:
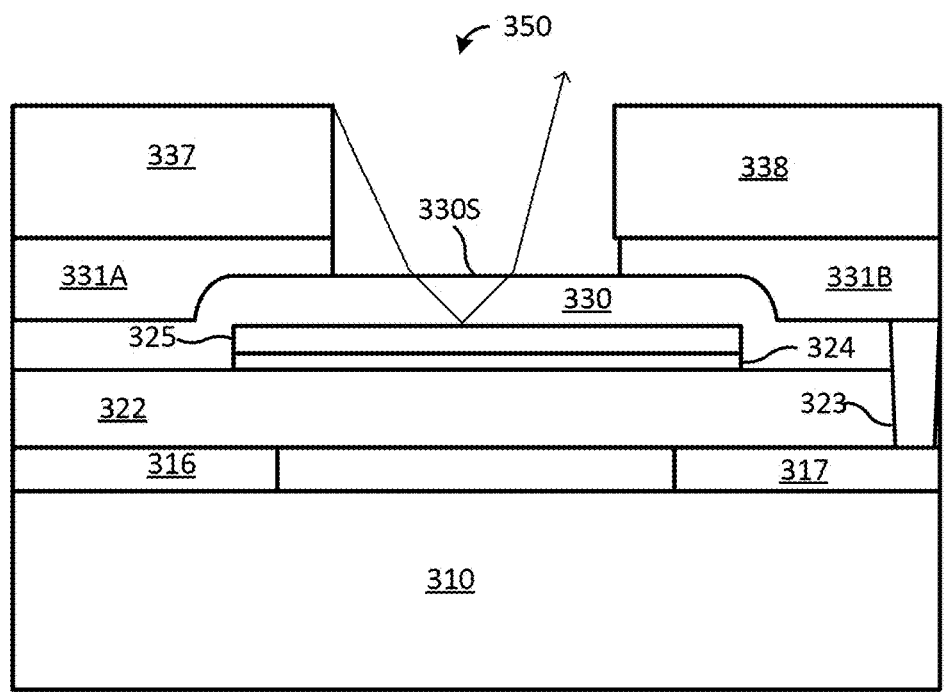
FIG. 3 illustrates a magnified cross-sectional view of a semiconductor device illustrating the reflective/absorptive structure in accordance with an embodiment of the present invention.

FIG. 3 illustrates a magnified cross-sectional view of a semiconductor device illustrating the reflective/absorptive structure in accordance with an embodiment of the present invention.

Referring to FIG. 3, the semiconductor device includes a semiconductor substrate 310, which may include doped regions for contacting the various device regions being formed in the semiconductor substrate 310. One or more metal levels are formed over the semiconductor substrate 310 in various embodiments. FIG. 3 illustrates two levels of metallization for illustration only. A first metal level comprises the first metal line 316 and a second metal line 317. A second metal level comprises the first chip contact pad 331A and the second chip contact pad 331B. A portion of the first LED chip 337 is attached to the first chip contact pad 331A while a portion of the second LED chip 338 is attached to the second chip contact pad 331B. The LED chips may comprise a plurality of LED devices or a discrete LED device.

Under the opening 350, a first metal layer 324 and a reflective layer 325 are formed. The first metal layer 324 may include a metal diffusion barrier layer and may include refractory metals such as titanium, tantalum and their nitrides. The first metal layer 324 may also help with the adhesion of the reflective layer 325 with the underlying layers. The reflective layer 325 may include a reflective metal such as silver, aluminum, and others. In various embodiment, the reflective layer 325 reflects light having wavelengths between 200 nm to 1000 nm.

As illustrated in FIG. 3, when a beam of light from one of the LED chips (or otherwise from a different source) travels towards the opening 350, it is reflected back by the reflective layer 325. In various embodiments, the reflective layer 325 has a thickness of about 10 nm to about 50 nm. In one embodiment, the reflective layer 325 has a thickness of 0.2 micron to 1 micron.

A protective layer 330 is disposed over the reflective layer 325. In one embodiment, the transparent insulating layer comprises a nitride. The protective layer 330 helps to protect the underlying reflective layer 325 from the environment and from various chemicals during processing. The protective layer 330 is selected so that light reflected from the reflective layer 325 is refracted through the protective layer 330 and not reflected back to the reflective layer 325. In some embodiments, the protective layer 330 may be replaced with a light absorptive material that absorbs a fraction of light passing through. However, such a layer may have limited absorption capacity due to the limited thickness.

In various embodiments, the protective layer 330 is not a planar layer because of the formation of the structured first metal layer 324 and the reflective layer 325. However, planar structures may also be formed using a planarization process as will be described in further embodiments below.

In various embodiments, the reflective layer 325 is positioned to be as near to the uppermost surface 330S of the chip as possible. Accordingly, in one or more embodiments, the reflective layer 325 is positioned to be between the uppermost metallization level (which includes the first metal lines 321) and the contact pads. In various embodiments, the reflective layer 325 is positioned to be between 10 nm to 50 nm from the uppermost surface 330S of the chip.

FIGS. 4A-4D illustrate a semiconductor device during various stages of fabrication in accordance with embodiments of the present invention.

FIGS. 4A-4D illustrate the process steps that may be involved in forming the structures illustrated in FIGS. 1-3 in accordance with embodiments of the present invention.

Figure 4A:
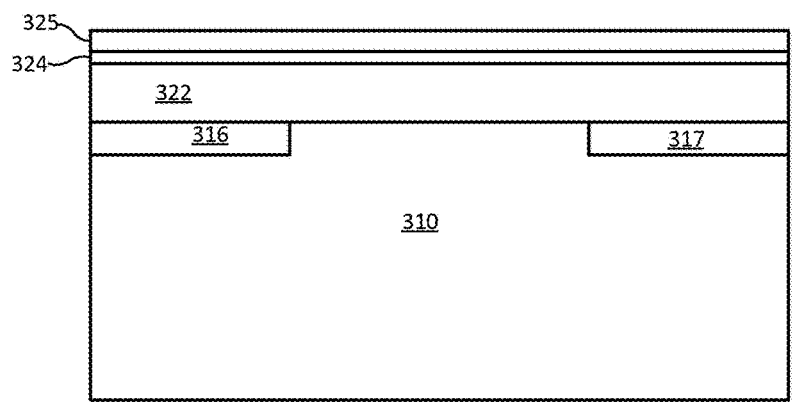

FIG. 4A illustrates a semiconductor device after completion of typical metallization processes. Accordingly, the uppermost metal level includes the first metal line 316 and the second metal line 317. As next illustrated in FIG. 4A, a passivation layer 322 is formed over the uppermost metallization level. In FIG. 4A, only the last metal level is illustrated for simplicity and clarity.

The passivation layer 322 may comprise an oxide layer in or more embodiments. The passivation layer 322 may be an inter-level dielectric material in one embodiment. In various embodiments, the passivation layer 322 comprises silicon oxide, silicon nitride, silicon oxy nitride, silicon oxy carbide, silicon carbo-nitride, a polymer dielectric, BCB, polyimide, photoimide, or combination thereof.

A first metal layer 324 and a reflective layer 325 are deposited over the passivation layer 322. The first metal layer 324 may be a diffusion barrier and also an adhesion promoter in various embodiments. The first metal layer 324 may comprise titanium, tantalum, ruthenium, tungsten, carbides thereof, nitrides thereof, or a combination thereof. The first metal layer 324 is deposited using a sputtering process such as radio frequency (RF) magnetron sputtering in one embodiment. However, in other embodiments, the first metal layer 324 may be deposited using any other deposition process such as chemical vapor deposition. The first metal layer 324 has a thickness of about 1 nm to about 10 nm in various embodiments.

A reflective layer 325 is deposited over the first metal layer 324. The reflective layer 325 comprises a reflective metal. The reflective layer 325 is formed so as to form a highly reflective top surface for 200 nm to 1500 nm light, and visible light in one embodiment.

In one embodiment, the reflective layer 325 comprises aluminum, silver, or other materials with high reflectivity. In various embodiments, the reflective layer 325 has a total reflectivity of at least 95%, and about 96% to 99% in various embodiments. In further embodiments, the reflective layer 325 may be high reflective with a total reflectivity between 99% to 99.99%.

The reflective layer 325 may be deposited using a deposition process such as vapor deposition. In one or more embodiments, the reflective layer 325 may be deposited using a sputtering process such as RF magnetron sputtering.

In one embodiment, the reflective layer 325 comprises a metallic material such as aluminum, silver, chromium, nickel-chromium, gold, and combinations thereof. In another embodiment, the reflective layer 325 comprises a high reflectance dielectric layer. In further embodiments, the reflective layer 325 comprises a stack of layers, for example, a metallic layer over which a reflective dielectric layer is formed.

In some embodiments, the top surface of the reflective layer 325 may be anodized in some embodiments to form a protective layer.

The reflective layer 325 may have a thickness of about 10 nm to about 100 nm in various embodiments. In one embodiment, the reflective layer 325 has a thickness of about 20 nm to about 50 nm.

Figure 4B:
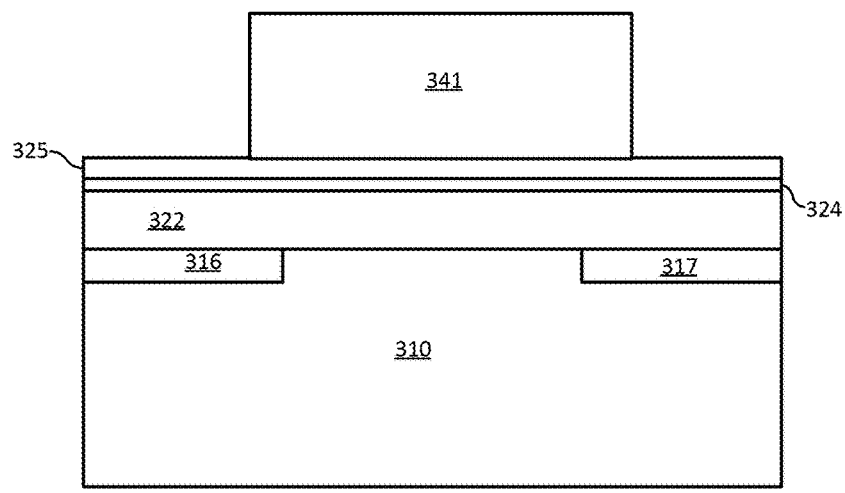

FIG. 4B illustrates the semiconductor device after forming a patterned resist layer in accordance with an embodiment of the present invention.

A resist layer 341 is deposited and patterned as illustrated in FIG. 4B. In various embodiments, the resist layer 341 may comprise a hard mask layer such as silicon nitride and/or silicon oxide. A photo resist layer may be deposited over the hard mask layer and patterned using lithography. Using the patterned photo resist layer as an etch mask, the hard mask layer is patterned using an etching process such as a reactive ion etching process to produce the patterned resist layer 341.

Figure 4C:
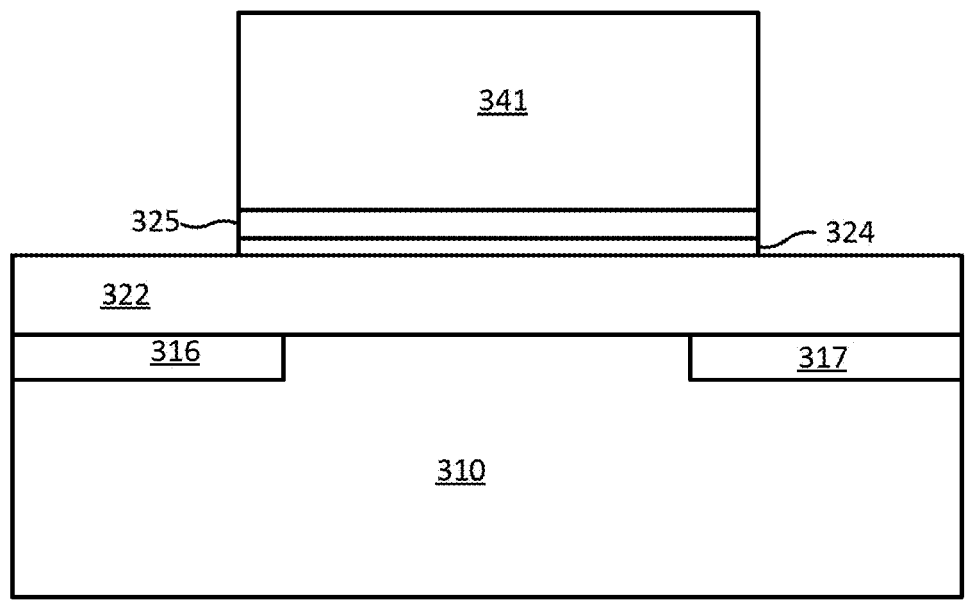

FIG. 4C illustrates the semiconductor device after forming a patterned reflective layer in accordance with an embodiment of the present invention.

Using the patterned resist layer 341 as an etch mask, the underlying reflective layer 325 and the first metal layer 324 are etched. In one or more embodiments, an anisotropic wet etching process may be used to etch the reflective layer 325. In various embodiments, the same etch chemistry may be used to etch both the reflective layer 325 and the first metal layer 324.

Figure 4D:
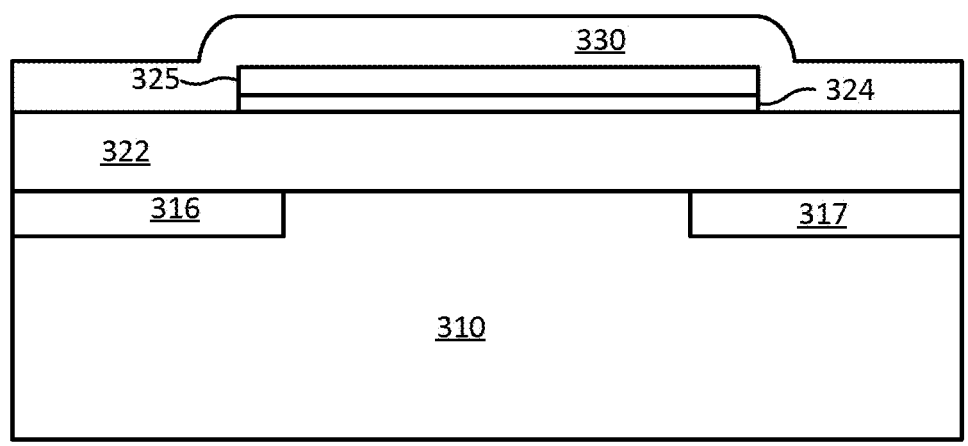

FIG. 4D illustrates the semiconductor device after forming a protective layer in accordance with an embodiment of the present invention.

A protective layer 330 is deposited over the patterned reflective layer 325. In one or more embodiments, the protective layer 330 may be deposited using a chemical vapor deposition (CVD) process including a plasma enhanced CVD process, physical vapor deposition, or coating processes including spin-on processes.

In one embodiment, the protective layer 330 comprises silicon nitride. In other embodiments, the protective layer 330 may comprise doped glass (BPSG, PSG, BSG), organo silicate glass (OSG), carbon doped oxides (CDO), fluorinated silicate glass (FSG), spin-on glass (SOG), and others. Subsequent process may continue as in conventional processing, for example to form the contact pads on the top most surface of the chip.

FIGS. 5A-5D illustrate a semiconductor device during various stage of fabrication with a light absorption structure in accordance with alternative embodiments of the present invention.

Figure 5A:
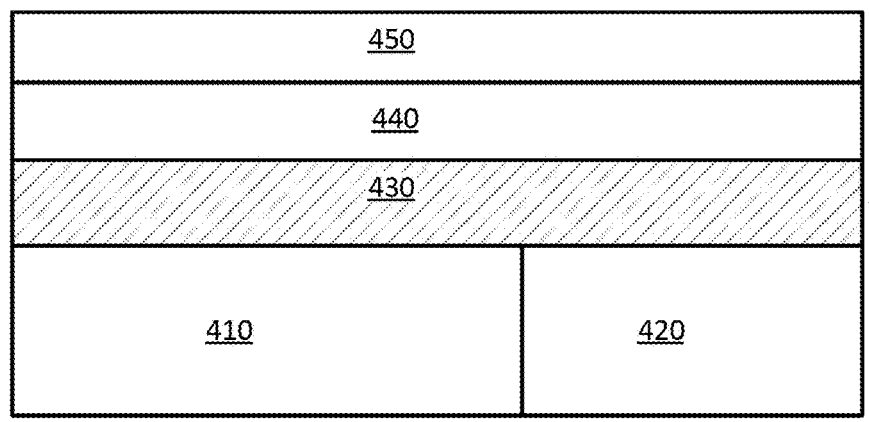

FIG. 5A illustrates a semiconductor device after forming an amorphous layer over the top most metal level in accordance with an embodiment of the present invention. FIG. 5A illustrates the uppermost metal level comprising a first metal line 410 proximate an isolation region 420, which may be a portion of an inter level dielectric layer.

An insulation layer 430 is formed over the first metal line 410. In one embodiment, after forming the first metal line 410, an insulation material is formed over and around the first metal line 410. In one embodiment, the insulation layer 430 comprises an oxide. In one or more embodiments, the insulation layer 430 is deposited using a vapor deposition process such as physical vapor deposition, chemical vapor deposition, high density plasma deposition, plasma enhanced chemical vapor deposition, and others.

The insulation material is planarized, for example, using a chemical mechanical planarization process to form the isolation region 420 and the insulation layer 430, which may be a continuous region.

An amorphous layer 440 is deposited over the insulation layer 430. The amorphous layer 440 may be deposited using a chemical vapor deposition, physical vapor deposition, metalorganic chemical vapor deposition, and other processes in various embodiments.

In various embodiments, the amorphous layer 440 comprises amorphous semiconductors including amorphous silicon, amorphous silicon germanium, amorphous carbon, and amorphous silicon carbon.

In various embodiments, the amorphous layer 440 has a thickness of about 0.3 micron to about 5 micron. In one embodiment, the amorphous layer 440 has a thickness of 1 micron to 3 micron. In one embodiment, the amorphous layer 440 has a thickness of 0.2 micron to 1 micron.

The thickness of the amorphous layer 440 is directly proportional to the ability of light absorbed by the amorphous layer 440. For example, when the amorphous layer 440 comprises amorphous silicon, about 65% of light at wavelength of 500 nm is absorbed during transmission in a 1 micron thick amorphous silicon layer, whereas 87% of light at wavelength of 500 nm is absorbed during transmission in a 2 micron thick amorphous silicon layer and 95% of light at wavelength of 500 nm is absorbed during transmission in a 3 micron thick amorphous silicon layer. Therefore, depending on the application, the thickness of the amorphous layer 440 is adjusted. However, longer wavelengths are poorly absorbed in amorphous silicon and need a thicker layer. At the same time, a thin metal layer very effectively reflects longer wavelengths while metals are not good at reflecting shorter wavelengths. For example, gold is a poor reflector of light that is shorter than 500 nm while it is an excellent reflector of light that is longer than 500 nm in wavelength. Other metals such as aluminum or silver are also not efficient reflectors of light at shorter wavelength although they perform better than gold. Therefore, a combination of (e.g., gold) reflector pads (as described in FIG. 1) along with absorption pads described in FIG. 5A-5D can efficiently eliminate harmful radiation across a wide range of wavelengths.

A nitride layer 450 is deposited over the amorphous layer 440. The nitride layer 450 may comprise silicon nitride or silicon oxy nitride in one or more embodiments. The nitride layer 450 may be deposited using vapor deposition processes in various embodiments.

Figure 5B:
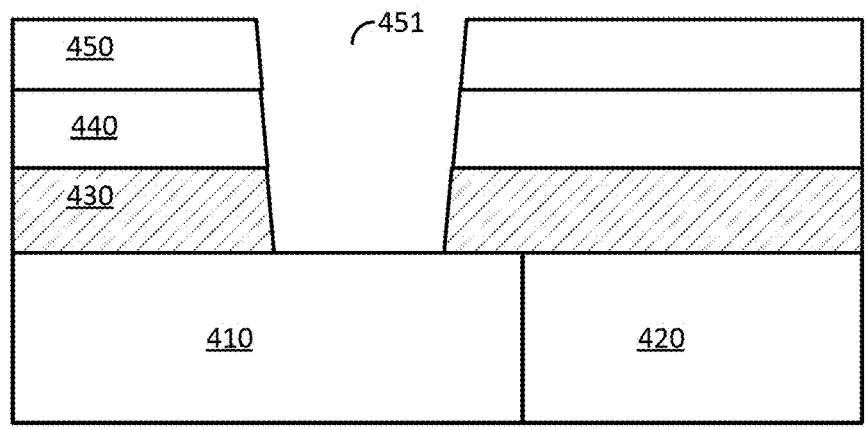

FIG. 5B illustrates a semiconductor device after forming an opening in accordance with an embodiment of the present invention.

An opening 451 is formed through the nitride layer 450, the amorphous layer 440, and the insulation layer 430. The opening 451 may be formed using a single etch process in one embodiment. The openings 451 are for forming contacts to the underlying metal levels such as the first metal line 410. However, the openings 451 have to be isolated from the amorphous layer 440 to avoid parasitic effects introduced by these layers.

Figure 5C:
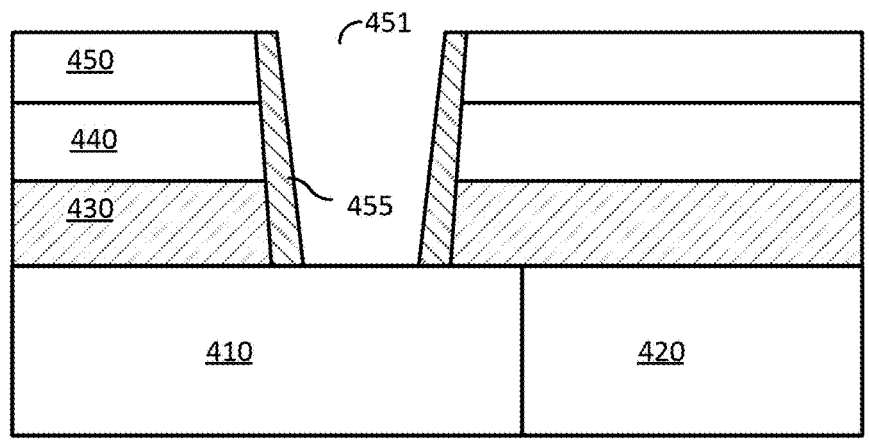

FIG. 5C illustrates a semiconductor device after forming insulating sidewalls spacers in accordance with an embodiment of the present invention.

Insulating sidewalls spacers 455 are formed on the sidewalls of the opening 451. The insulating sidewall spacers 455 may be formed by depositing a layer of oxide and then etching the layer of oxide using an anisotropic etching process. In other embodiments, the insulating sidewall spacers 455 may be formed by depositing a layer of nitride or other dielectric material and then etching the deposited layer using an anisotropic etching process. In various embodiments, the insulating sidewalls spacers 455 may also include a stack of layers such as oxide/nitride, oxide/nitride/oxide, and others.

Figure 5D:
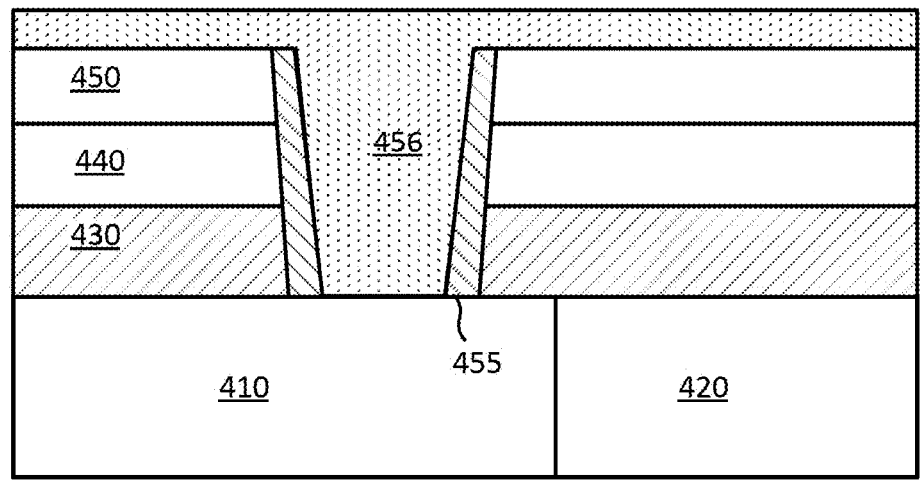

FIG. 5D illustrates a semiconductor device after filling the openings with a conductive material in accordance with an embodiment of the present invention.

The opening 451 is filled with a conductive material 456 using a deposition process such as sputtering. The conductive material 456 may comprise tungsten in one embodiment. Prior to filling the opening 451 with the conductive material 456, a diffusion barrier and an adhesion promoter may be deposited to avoid diffusion of metal from the underlying first metal line 410. For example, a layer of titanium, tantalum, titanium nitride, tantalum nitride, tungsten nitride, tungsten carbide, and others may be deposited.

Figure 5E:
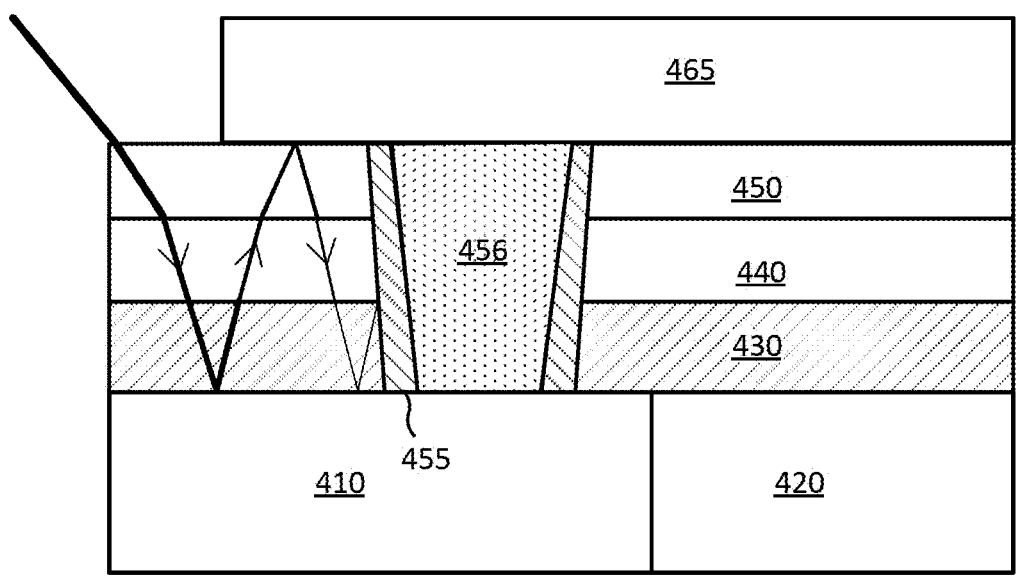
FIG. 5E illustrates a semiconductor device after forming contact pad structures.

FIG. 5E illustrates a semiconductor device after forming contact pad structures in accordance with an embodiment of the present invention.

The conductive material 456 is planarized using, for example, a chemical mechanical planarization process. The conductive pad structure 465 is formed over the conductive material 456 and the nitride layer 450.

As illustrated in FIG. 5E, a ray of light passing between adjacent conductive pad structures 465 is absorbed within the amorphous layer 440 during repeated internal reflections between the reflective surfaces of the conductive pad structure 465 and the first metal line 410.

Figure 6A:
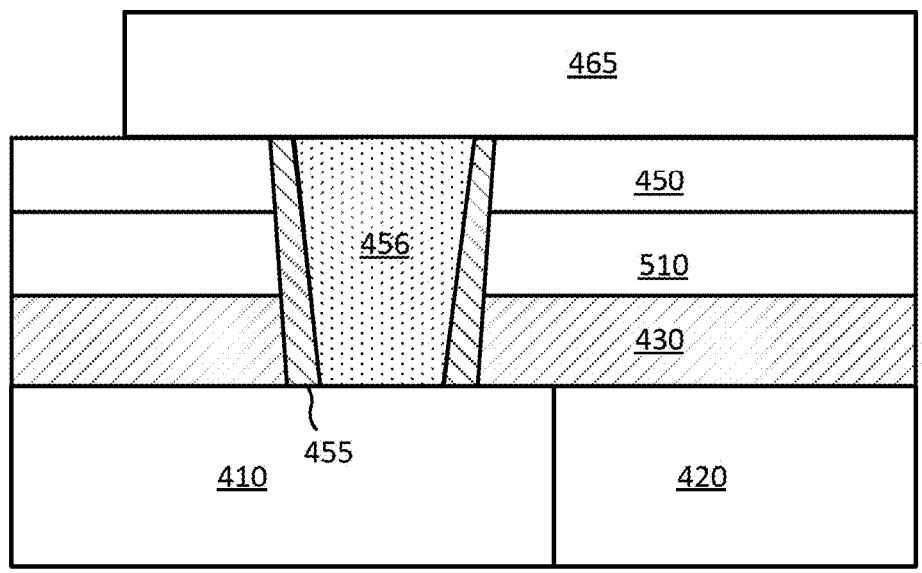
Figure 6B:
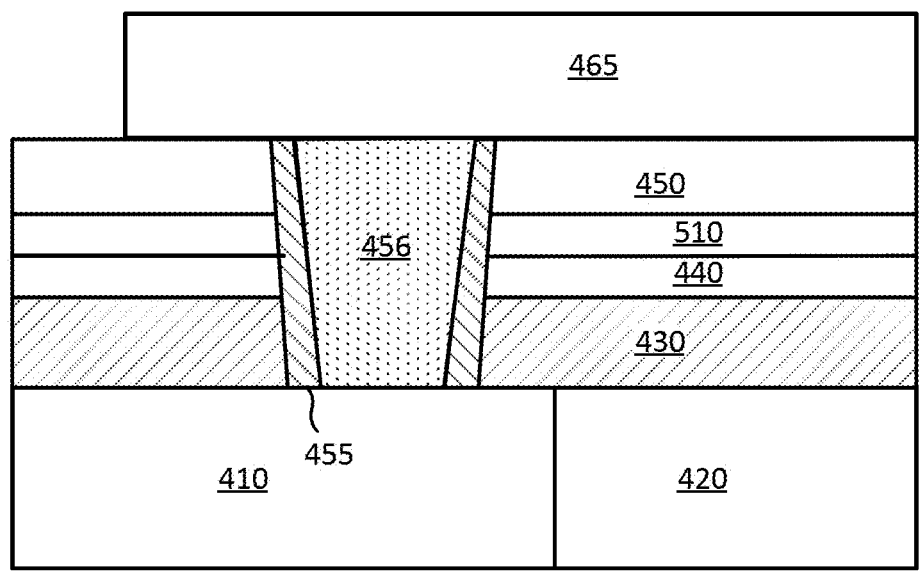
Figure 6C:
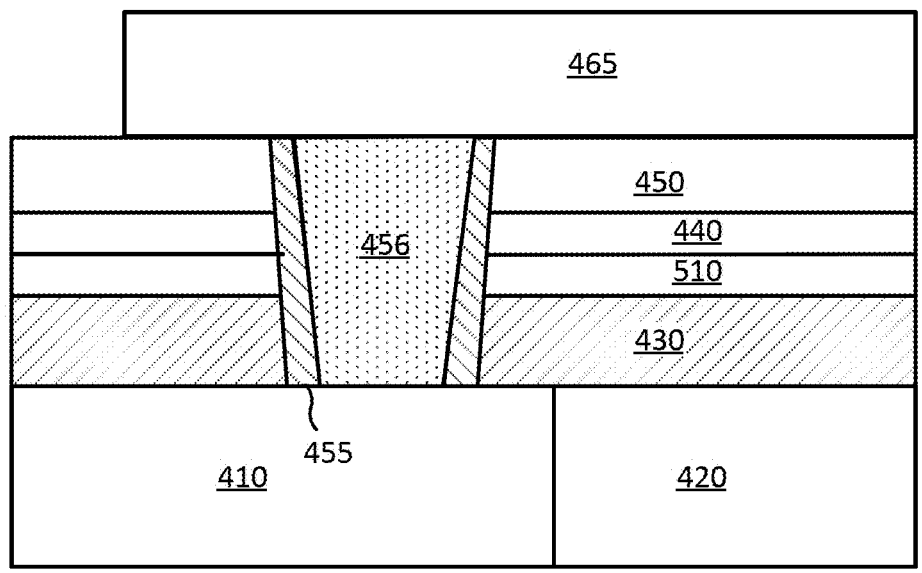

FIGS. 6A-6C illustrate alternative embodiments combining the prior embodiments. In FIG. 6A, a metallic layer 510 replaces the amorphous layer 440 whereas FIGS. 6B and 6C illustrate both a metallic layer 510 and the amorphous layer 440. FIG. 6B shows an opposite stacking of the metallic layer 510 and the amorphous layer 440 relative to FIG. 6C. The process of forming the structures described in FIGS. 6A-6C may be similar to that described in FIGS. 5A-5E. The metallic layer 510 may be formed using a sputtering process, for example. As described previously, the amorphous layer 440 in FIGS. 6B and 6C comprises about 0.3 micron to about 5 micron thick amorphous silicon in various embodiments, and 0.5 micron to 3 micron in one embodiment.

FIGS. 7A-7F illustrate various stages of fabricating a semiconductor device having an amorphous structure and a reflective layer on different levels in accordance with an embodiment of the present invention.

Figure 7A:
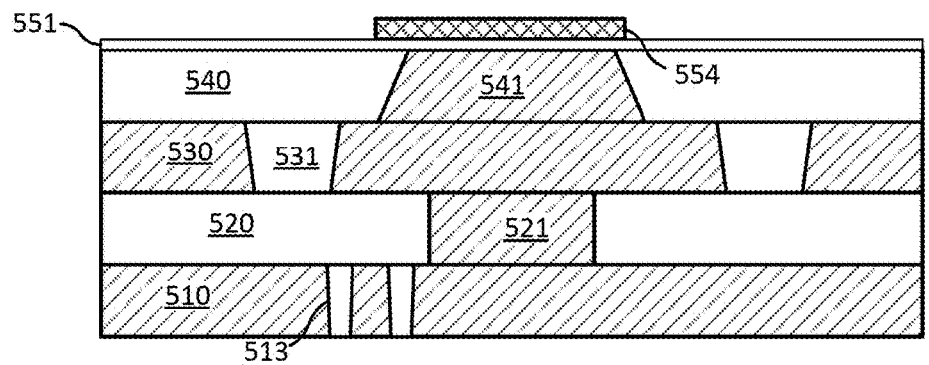

FIG. 7A illustrates a cross-sectional view of a semiconductor device during fabrication after forming a patterned amorphous structure over the metallization of a semiconductor substrate in accordance with an embodiment of the present invention.

Referring to FIG. 7A, a semiconductor device after front end and back end processing is shown. The metallization for the semiconductor device includes a first inter level dielectric layer 511, a second inter level dielectric layer 521, a third inter level dielectric layer 530, a fourth inter level dielectric layer 541.

Similar to other embodiments, an upper metal level 540 and an intermediate metal level 520 are illustrated. The intermediate and upper metal levels 520 and 540 are connected through vias 531. Similarly, the intermediate metal level 520 is connected to lower metal levels through vias 513.

An etch stop liner 551 is formed over the fourth inter level dielectric layer 541 comprising the upper metal level 540. In one embodiment, the etch stop liner 551 comprises a nitride.

An amorphous structure 554 is formed over the etch stop liner 551 using a lithography process. The amorphous structure 554 is deposited using processes such as a plasma process in various embodiments. Example processes for depositing the amorphous structure 554 include radio frequency plasma enhanced chemical vapor deposition, In various embodiments, the amorphous structure 554 comprises amorphous silicon. In other embodiments, the amorphous structure 554 comprises semiconductors such as silicon germanium, silicon carbide, gallium arsenide, gallium nitride as further examples. The precursor composition may be adjusted when other semiconductors are deposited. For example, silicon germanium may be deposited using $SiH_4$ and $GeH_4$. In various embodiments, the thickness of the amorphous structure 554 is as described in prior embodiments.

Once the amorphous structure 554 is deposited, the thermal budget of the remaining processes has to be carefully controlled so as to avoid crystallization of the amorphous material into crystalline material. Accordingly, subsequent processes are controlled to be less than 450° C. in various embodiments.

The ability of the amorphous structure 554 to function as an absorption layer depends on the amount of amorphous content in the amorphous structure 554 relative to the crystalline content in the amorphous structure 554. Therefore, in some embodiments, impurities may be added to the amorphous structure 554 to prevent crystallization during subsequent processing. For example, in one embodiment, the amorphous structure 554 comprises amorphous silicon with additional fluorine, nitrogen, chlorine atoms. The fluorine, nitrogen, chlorine may be introduced prior to patterning the amorphous structure 554 by an implantation process. Alternatively, fluorinated amorphous silicon may be directly deposited during the formation of the amorphous structure 554 in some embodiments. For example, a vapor deposition process such as plasma enhanced chemical vapor deposition may be used to deposit the amorphous structure 554. In such embodiments, the chemistry of the precursor gases may be changed to introduce fluorine into the amorphous silicon by using, for example, $SiF_4$ along with silanes ($Si_nH_{2n+2}$) such as $SiH_4$, and $Si_2H_6$, and others.

Figure 7B:
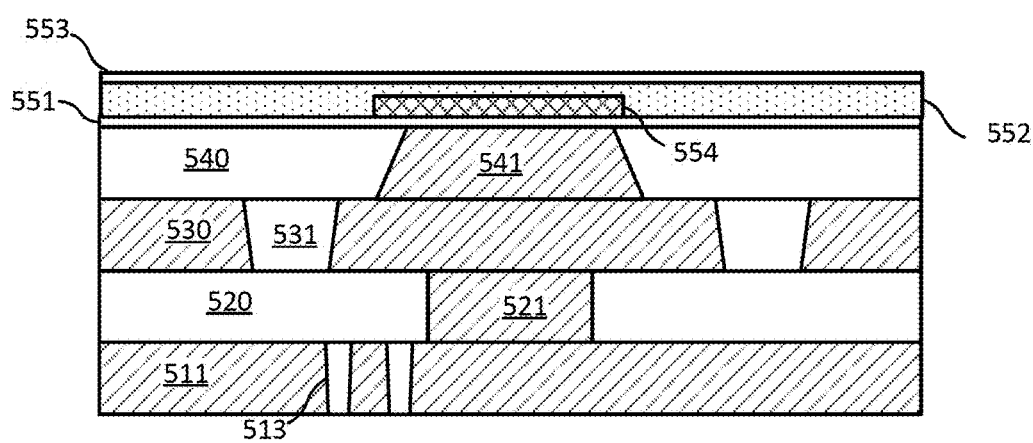

FIG. 7B illustrates a cross-sectional view of a semiconductor device during fabrication after covering the patterned amorphous structure with a protective layer in accordance with an embodiment of the present invention.

Referring to FIG. 7B, a fifth inter level dielectric layer 552 is formed over the patterned amorphous structure 554. The fifth inter level dielectric layer 552 may comprise the same composition as the underlying fourth inter level dielectric layer 541 in one embodiment. In other embodiments, the fifth inter level dielectric layer 552 may comprise an oxide such as TEOS oxide. After depositing the fifth inter level dielectric layer 552, a planarization process may be performed. A second etch stop liner 553 may be deposited over the fifth inter level dielectric layer 552.

Figure 7C:
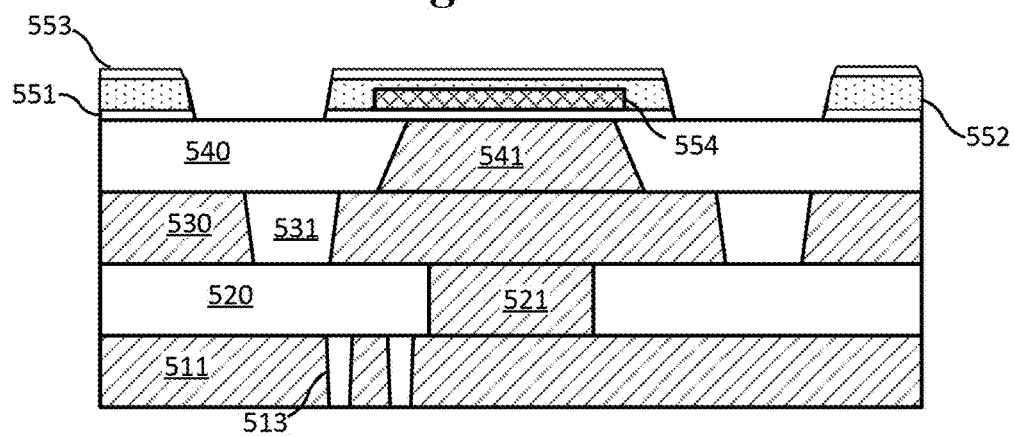

FIG. 7C illustrates a cross-sectional view of a semiconductor device during fabrication after covering the patterned amorphous structure with a protective layer in accordance with an embodiment of the present invention.

The fifth inter level dielectric layer 552 is patterned to open the underlying metal lines in the upper metal level 540. The patterning may be performed by forming an etch mask using a lithographic process and followed by an anisotropic etching processes.

Figure 7D:
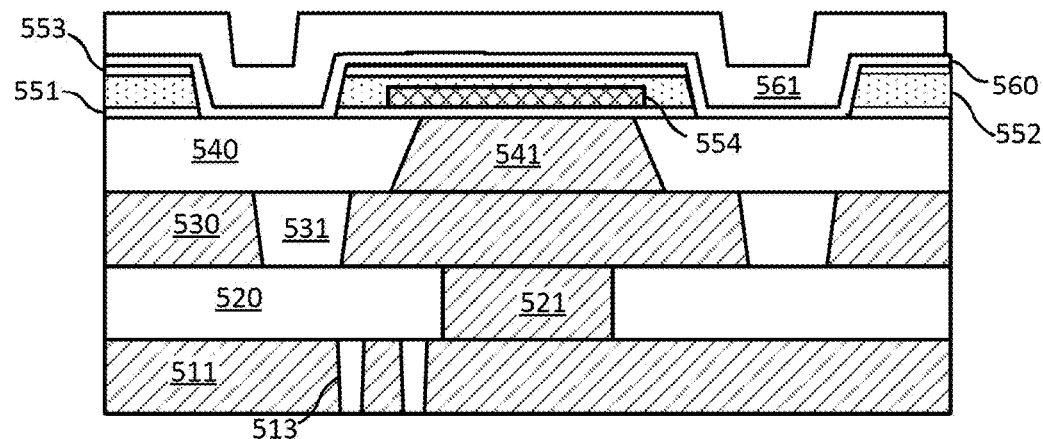

FIG. 7D illustrates a cross-sectional view of a semiconductor device during fabrication after forming a reflective metal layer in accordance with an embodiment of the present invention.

A conductive liner 560 and a conductive reflective layer 561 is deposited over the fifth inter level dielectric layer 552. In various embodiments, the conductive liner 560 comprises titanium, titanium nitride, tantalum, tantalum nitride, and others. The conductive reflective layer 561 comprises aluminum, silver, gold, platinum, nickel, chromium, and combinations thereof. In one embodiment, the conductive reflective layer 561 is deposited using a physical vapor deposition process although in other embodiments any suitable deposition process may be used. In various embodiments, the conductive reflective layer 561 may have a thickness of about 50 nm to about 600 nm, and 200 nm to 400 nm in one embodiment. The conductive reflective layer 561 is configured to reflect light as well as to form a conductive path from the underlying metal levels to the contact pads to be formed.

Figure 7E:
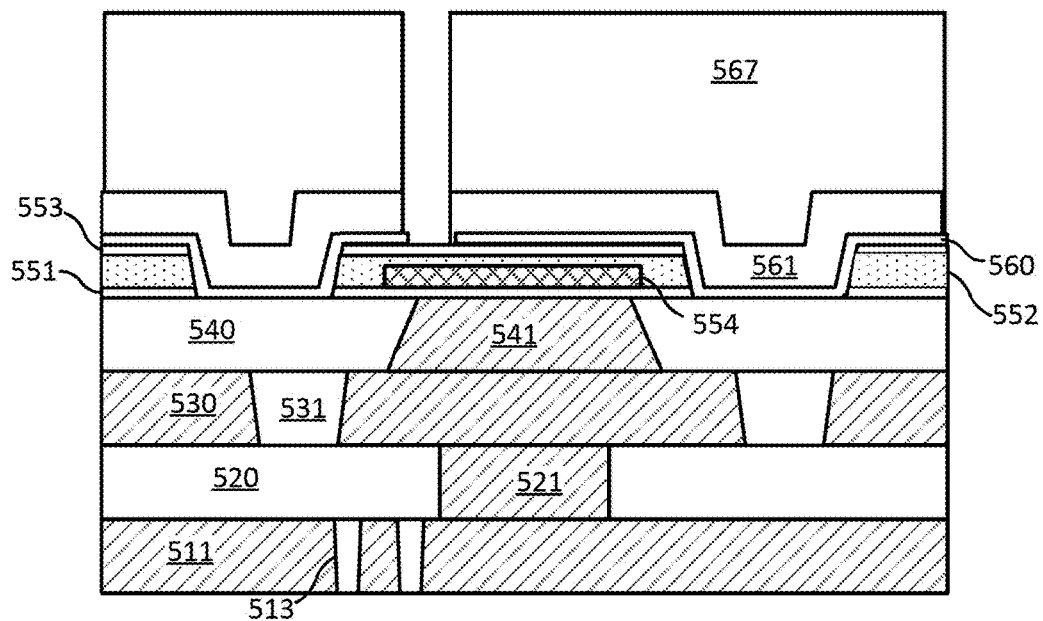

FIG. 7E illustrates a cross-sectional view of a semiconductor device during fabrication after forming openings in the reflective metal layer in accordance with an embodiment of the present invention.

In various embodiments, the blanket layer of the conductive reflective layer 561 and the conductive liner 560 are patterned so as to isolate adjacent pads. Accordingly, a resist layer 567 is formed using lithographic processes and the conductive reflective layer 561 and the conductive liner 560 are etched using an anisotropic etch process.

Figure 7F:
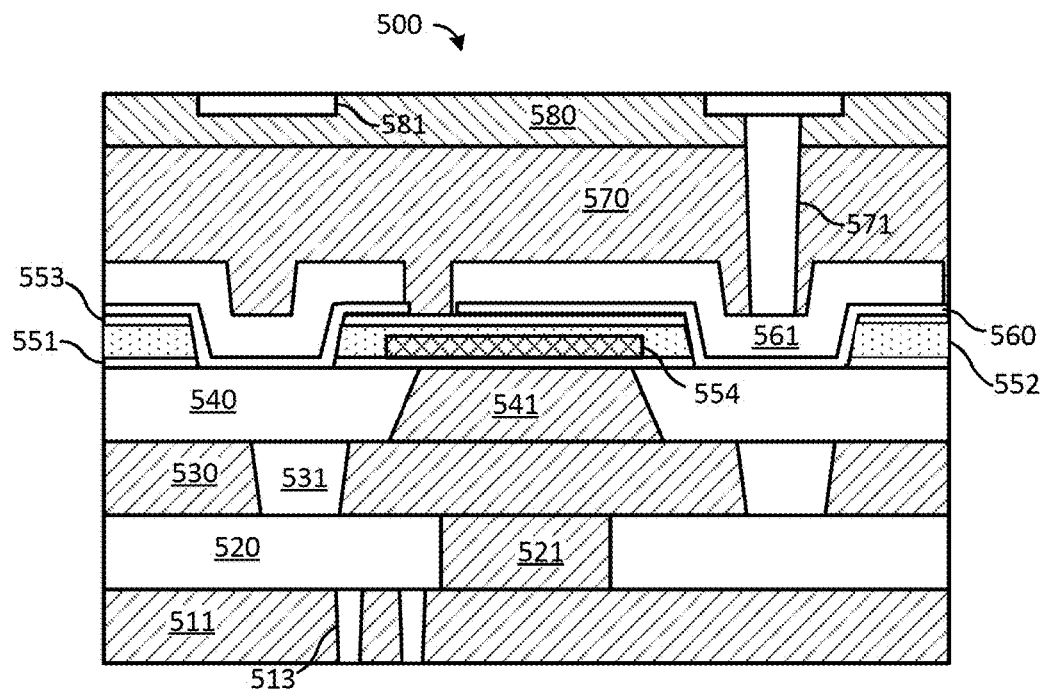

FIG. 7F illustrates a cross-sectional view of a semiconductor device during fabrication after pads in accordance with an embodiment of the present invention.

A first protection layer 570 is formed over the conductive reflective layer 561 and the conductive liner 560. The first protection layer 570 may comprise an oxide in one or more embodiments. The first protection layer 570 may have a thickness of about 500 nm to about 1000 nm in various embodiments. A second protection layer 580 is formed over the first protection layer 570. The second protection layer 580 may comprise a nitride in one embodiment.

Contact pad structures 581 are formed and are connected to the conductive reflective layer 561 through upper vias 571 disposed in the first and the second protection layers 570 and 580. The contact pad structures 581 may comprise gold in one embodiment.

The semiconductor substrate carrying a plurality of chips is thinned (from the back side) and singulated to form a plurality of chips 500. FIG. 7F illustrates a single chip 500 thus formed.

Figure 8:
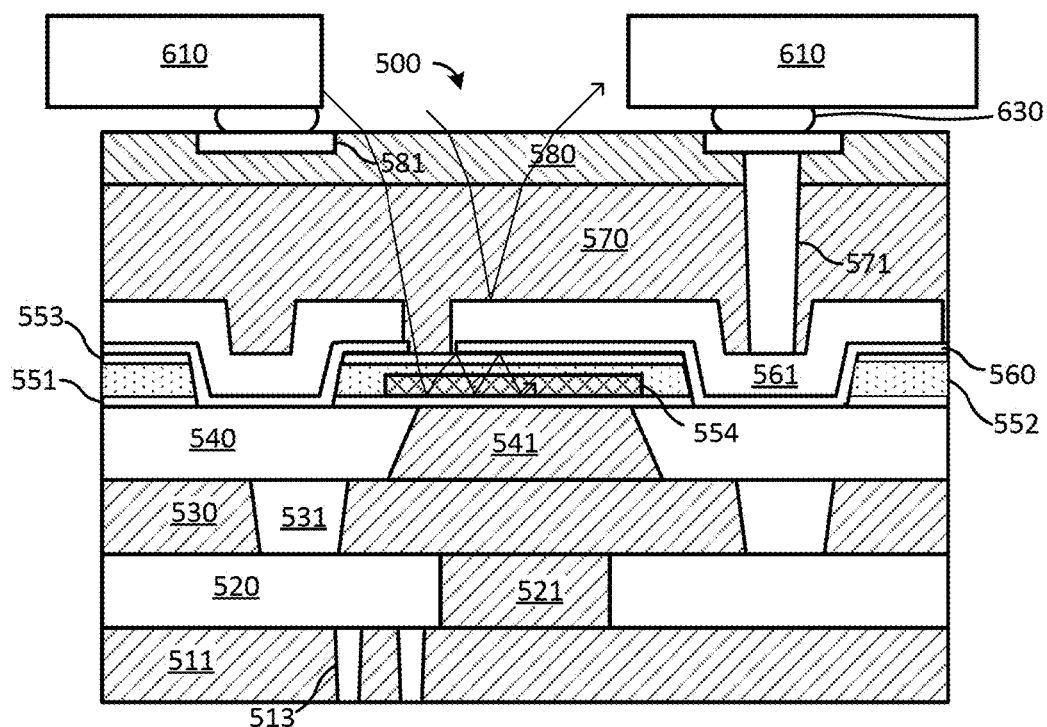
FIG. 8 illustrates a cross-sectional view of a semiconductor module comprising the semiconductor device secured to LED chips in accordance with an embodiment of the present invention.

FIG. 8 illustrates a cross-sectional view of a semiconductor module comprising the semiconductor device secured to LED chips in accordance with an embodiment of the present invention.

Light emitting diode (LED) chips 610 may be directly connected with the chip 500 thus fabricated (e.g., described above using FIGS. 7A-7F) by soldering to the contact pad structures 581. FIG. 8 illustrates solder bonds 630 securing the semiconductor chip 500 with the LED chips 610.

As shown in FIG. 8, the overlapping contact pad structures 581 and the conductive reflective layer 561 completely encapsulate the chip 500 with a reflective layer so that all light in the visible range is reflected back to protect chip circuit from the incoming light. In particular, light from the LED chips 610 may be about 400 nm to 500 nm, for example, 440 nm. The conductive reflective layer 561 has excellent reflectivity in the longer visible light ranges, for example, above 400 nm. In various embodiments, the conductive reflective layer 561 may have the structure described for the light reflection/absorption pads 30 in FIGS. 1A-1C, reflective layer 325 in FIGS. 3 and 4D, metallic layer 510 in FIGS. 6B and 6C, for example.

The amorphous structure 554 (if present) absorbs any remaining light that goes through the gaps (if any) in the conductive reflective layer 561 or the shorter wavelength light that is not reflected by the conductive reflective layer 561.

FIG. 9 illustrates a cross sectional view of a semiconductor device in which the reflective structures are designed to minimize parasitic effects in accordance with embodiments of the present invention.

As illustrated in FIG. 9, in one embodiment, the light reflection/absorption pads 30 are at the same potential as the corresponding contact pad structures 40. This minimizes parasitic capacitances between the light reflection/absorption pads 30 and the corresponding contact pad structures 40.

As described in various embodiments, a material that comprises a metal may, for example, be a pure metal, a metal alloy, a metal compound, an intermetallic and others, i.e., any material that includes metal atoms.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-8 may be combined with each other in alternative embodiments. It is therefore intended that the appended claims encompass any such modifications or embodiments.

What is claimed is:

1. A method of forming a semiconductor device, the method comprising:
    forming uppermost metal level comprising metal lines, the uppermost metal level being formed over a semiconductor substrate;
    forming light reflective/absorptive structures over the upper metal level; and
    forming contact pads over the light reflective/absorptive structures by aligning the light reflective/absorptive structures to be directly below gaps between adjacent contact pads.

2. The method of claim 1, wherein the contact pads overlap with the light reflective/absorptive structures, wherein the light reflective/absorptive structures comprises a different composition from the contact pads and the metal lines in the uppermost metal level.

3. The method of claim 1, wherein forming the light reflective/absorptive structures comprises:
    forming amorphous semiconductor structures over the metal lines; and
    forming reflective structures over and aligned with the amorphous semiconductor structures.

4. The method of claim 1, wherein forming the light reflective/absorptive structures comprises:
    forming reflective structures over the metal lines.

5. The method of claim 1, further comprising forming a protective layer over the light reflective/absorptive structures, wherein the contact pads are formed over the protective layer.

6. The method of claim 5, wherein the protective layer comprises a non-planar major surface.

7. The method of claim 1, wherein forming the light reflective/absorptive structures comprises:
    forming amorphous semiconductor structures over the metal lines, the amorphous semiconductor structures overlapping with the contact pads.

8. A method of forming a semiconductor device, the method comprising:
    forming an active region in a semiconductor substrate;
    forming an uppermost metal level comprising metal lines, the uppermost metal level being formed over the semiconductor substrate;
    forming reflective structures over the upper metal level and the active region;
    forming contact pads at a major surface of the semiconductor device, the contact pads coupled to the metal lines in the uppermost metal level; and
    forming an isolation region separating the contact pads at the major surface, wherein forming the isolation region comprises electrically isolating adjacent contact pads from one another by a portion of the isolation region, wherein each of the reflective structures that is directly over the active region completely overlaps an associated portion of the isolation region separating the contact pads.

9. The method of claim 8, further comprising:
    forming a contact via coupling one of the metal lines in the uppermost metal level to one of the contact pads; and
    forming a sidewall spacer to electrically isolate the contact via from the reflective structures.

10. The method of claim 8, wherein the reflective structures comprise a different composition from the contact pads and the metal lines in the uppermost metal level.

11. The method of claim 8, wherein the contact pads and the reflective structures together are configured to reflect all light in visible wavelength above 400 nm falling on the major surface of the semiconductor device.

12. The method of claim 8, further comprising directly soldering a light emitting diode (LED) chip to the contact pads.

13. The method of claim 8, wherein the reflective structures overlap with the contact pads over an overlap distance at each side.

14. The method of claim 13, wherein the overlap distance is between 500 nm to 5 micron.

15. The method of claim 8, wherein the reflective structures comprise gold, silver, or substantially aluminum, wherein the contact pads comprise substantially gold, and wherein the metal lines in the uppermost metal level comprise substantially copper, or aluminum.

16. The method of claim 8, further comprising forming amorphous semiconductor structures between the reflective structures and the upper metal level.

17. The method of claim 16, wherein the amorphous semiconductor structures have a thickness of 0.2 micron to 1 micron.

18. The method of claim 16, wherein the amorphous semiconductor structures comprise amorphous silicon, or fluorinated amorphous silicon.

19. A method of forming a semiconductor device, the method comprising:
    forming an uppermost metal level comprising metal lines over a semiconductor substrate;
    forming light absorptive structures over the upper metal level, wherein the light absorptive structures comprise an amorphous semiconductor material; and
    forming contact pads over the uppermost metal level, the contact pads being formed over the light absorptive structures, the contact pads coupled to the metal lines in the uppermost metal level.

20. The method of claim 19, further comprising:
    forming a contact via coupling one of the metal lines in the uppermost metal level to one of the contact pads; and
    forming a sidewall spacer electrically isolating the contact via from the light absorptive structures.

21. The method of claim 19, further comprising aligning the light absorptive structures with an isolation region separating the contact pads, wherein each one of the light absorptive structures is disposed directly under an associated portion of the isolation region.

22. The method of claim 19, wherein the light absorptive structures have a thickness of 0.2 micron to 1 micron.

23. The method of claim 19, wherein the amorphous semiconductor material comprises amorphous silicon or fluorinated amorphous silicon.

24. The method of claim 19, further comprising forming reflective structures between the upper metal level and the contact pads, wherein the reflective structures are aligned to be directly under gaps between adjacent contact pads.

25. The method of claim 24, wherein the reflective structures partially overlap with the contact pads, wherein the reflective structure comprises a different metal than the contact pads and the metal lines in the uppermost metal level.

26. The method of claim 1, further comprising:
wherein the contact pads coupled to the metal lines in the uppermost metal level.

27. The method of claim 1, further comprising:
forming an active region in a semiconductor substrate, wherein the light reflective/absorptive structures are over the active region; and
forming an isolation region between and under the contact pads at the major surface, wherein forming the isolation region comprises electrically isolating adjacent contact pads from one another by a portion of the isolation region, wherein each of the light reflective/absorptive structures that is directly over the active region completely overlaps an associated portion of the isolation region separating the contact pads.

* * * * *